(12) United States Patent
Kresge et al.

(10) Patent No.: US 6,689,543 B2
(45) Date of Patent: Feb. 10, 2004

(54) LASER ABLATABLE MATERIAL AND ITS USE

(75) Inventors: John S. Kresge, Binghamton, NY (US); John M. Lauffer, Waverly, NY (US); David J. Russell, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/073,558

(22) Filed: Feb. 11, 2002

(65) Prior Publication Data

US 2002/0094491 A1 Jul. 18, 2002

Related U.S. Application Data

(62) Division of application No. 09/375,957, filed on Aug. 17, 1999, now Pat. No. 6,361,923.

(51) Int. Cl.$^7$ .................................................. G03C 5/56
(52) U.S. Cl. ....................... 430/320; 430/322; 430/945; 430/300
(58) Field of Search ......................... 430/270.1, 280.1, 430/300, 320, 322, 945, 302

(56) References Cited

U.S. PATENT DOCUMENTS

| | | | | |
|---|---|---|---|---|
| 4,025,348 A | * | 5/1977 | Tsukada et al. | 430/280.1 |
| 4,163,097 A | | 7/1979 | Baumann et al. | 525/531 |
| 4,841,010 A | | 6/1989 | Dodiuk | 528/99 |
| 4,915,981 A | | 4/1990 | Traskos et al. | 427/53.1 |
| 5,026,624 A | * | 6/1991 | Day et al. | 430/280.1 |
| 5,223,356 A | | 6/1993 | Kumar et al. | 430/1 |
| 5,227,013 A | | 7/1993 | Kumar | 156/644 |
| 5,300,402 A | | 4/1994 | Card, Jr. et al. | 430/280 |
| 5,450,232 A | | 9/1995 | Sasaki et al. | 359/341 |
| 5,480,762 A | * | 1/1996 | Toyama et al. | 101/463.1 |
| 5,493,096 A | | 2/1996 | Koh | 219/121.71 |
| 5,508,328 A | | 4/1996 | Olson | 523/445 |
| 5,576,144 A | | 11/1996 | Pearce et al. | 430/270.15 |
| 5,654,125 A | | 8/1997 | Fan et al. | 430/306 |
| 5,674,661 A | | 10/1997 | Neumann | 430/270.1 |
| 5,712,079 A | | 1/1998 | Robello et al. | 430/270.1 |
| 5,725,993 A | | 3/1998 | Bringley et al. | 430/269 |
| 5,731,047 A | | 3/1998 | Noddin | 427/555 |
| 5,759,741 A | | 6/1998 | Pearce et al. | 430/271.1 |
| 5,872,196 A | | 2/1999 | Murata et al. | 525/508 |
| 5,874,009 A | | 2/1999 | Inada et al. | 216/20 |
| 5,922,414 A | * | 7/1999 | Gabriele | 427/265 |
| 5,993,945 A | * | 11/1999 | Russell et al. | 174/258 |
| 6,014,929 A | * | 1/2000 | Teng | 101/450.1 |
| 6,022,670 A | * | 2/2000 | Russell et al. | 430/315 |
| 6,071,675 A | * | 6/2000 | Teng | 101/452 |
| 6,131,279 A | * | 10/2000 | Jones et al. | 29/846 |
| 6,204,456 B1 | * | 3/2001 | Lauffer et al. | 174/262 |
| 6,242,156 B1 | * | 6/2001 | Teng | 101/454 |

FOREIGN PATENT DOCUMENTS

JP  9328482 A  12/1997

OTHER PUBLICATIONS

IBM Technical Disclosure Bulletin, vol. 34, No. 12, May, 1992, Wirestripping Procedure Using Visible Laser Radiation and Dye–Doped Insulation.

Research Disclosure n285, Jan., 1988, Chuang et al, "Doped Polymide Etching by Laser Ablation".

"Semiconductor Lithography, Principles, Practices and Materials" by Moreau, Microdevices, Physics and Fabrication Technologies, 1988, pp. 605, 606, 910.

"Laser Ablation of Doped Polymer Systems" by Lippert et al, Advanced Materials, 1997, 9, No. 2, pp 105–119.

"High Performance Carrier Technology: Materials And Fabrication", by Light et al, 1993 International Electronics Packaging Conference, San Diego, California, vol. One, p 440–456.

"High Performance Carrier Technology", by Heck et al. 1993 International Electronics Packaging Conference, San Diego, California, vol. One, p 771–779.

* cited by examiner

*Primary Examiner*—Janet Baxter
*Assistant Examiner*—Yvette C. Thornton
(74) *Attorney, Agent, or Firm*—William N. Hogg

(57) ABSTRACT

An epoxy based resin which exhibits good laser ablation and good adherence to a substrate such a copper is provided by adding to the resin a dye or dyes having substantial energy absorption at the emission wave lengths of lasers used to laser ablate the resin. The resin with the dye or dyes included is coated onto a substrate and cured, or laminated onto a substrate in the cured condition. The required openings are formed in the cured film by laser ablation. This allows for the use of optimum techniques to be used to form micro vias.

4 Claims, No Drawings

LASER ABLATABLE MATERIAL AND ITS USE

CROSS REFERENCE TO RELATED APPLICATION

This application is a divisional of application Ser. No. 09/375,957, filed Aug. 17, 1999 U.S. Pat. No. 6,361,923.

FIELD OF THE INVENTION

This invention relates generally to a laser ablatable material and its use and, more particularly, to an epoxy base laser ablatable material and its use to form a dielectric substrate having micro vias therein

BACKGROUND INFORMATION

One typical technique for forming a dielectric layer of material with vias therein is to utilize an epoxy base, photoimageable material coated onto a substrate, such as another dielectric material or a conductive material, and form the vias or other openings therein by photolithographic techniques. Particularly suitable materials are described in U.S. Pat. No. 5,026,624 and 5,300,402, and U.S. patent application Ser. No. 09/212,204, filed Dec. 15, 1998, all commonly assigned, and all of which are incorporated herein by reference. As described in these patents and patent application, the photoimageable material is coated onto a substrate and U.V. light of the appropriate wavelength is used to expose the desired pattern on the photoimageable material, after which the material is developed to form the desired vias and other openings in the material.

For many applications, this is a very successful technique. However, in specific applications, certain difficulties may be encountered in using photolithographic techniques. For example, in certain applications, copper foil is laminated to a dry film of material made according to the teachings of either U.S. Pat. No. 5,665,650 or 5,670,750 and results in very narrow process windows and manufacturing limitations. In particular, to achieve optimum adhesion of the foil to the dielectric material, a low exposure dose is required. However, too low an exposure will induce defects upon stressing, and too high an exposure dose will result in degradation of the bond between the foil and the dielectric material. Thus, in some cases, an optimum dosage to achieve good peel strengths is not adequate for small micro via definition. Moreover, when exposure through artwork is required, defects, such as dust particles, scratches etc., will print through, leaving a defect in the dielectric layer. With laser ablation, photo induced defects will not appear on the dielectric layer.

SUMMARY OF THE INVENTION

According to the present invention, an epoxy based resin which exhibits good laser ablation and good adherence to a substrate, such as copper, is provided by adding to the resin a dye or dyes having substantial energy absorption at the emission wave lengths of lasers used to laser ablate the resin. In one embodiment, the resin is coated onto a substrate and cured, or laminated onto a substrate. Then the cured film is laser ablated to form the desired pattern of openings. The film can also be either laminated or coated and cured onto a copper foil, and the dielectric with the copper foil thereon laminated to a substrate, This allows for the use of optimum techniques to be used to form micro vias.

DESCRIPTION OF THE PREFERRED EMBODIMENTS

According to the present invention, an improved epoxy based laser ablatable material is provided. The improvement in laser ablatability is achieved by incorporating into the epoxy based composition one or more dyes which increase the energy absorption of the base composition at the emitted wave length of the laser that is used to laser ablate. As is well known in the art, different lasers emit at different wavelengths. Some examples include excimer lasers which emit at either 308 nm or 248 nm, YAG lasers which emit at 532 nm, 355 nm, or 266 nm, and $CO_2$ lasers which emit at 10600 nm. Thus, a dye that has an absorbance at or near these wavelengths incorporated into the epoxy base will significantly enhance the laser ablation properties of the epoxy based resin. For example, Rhodamine B has a maximum absorbance at 543 nm, Ethyl Violet has a maximum absorbance at 596 nm, 2', 7'dichlorofluorescein has a maximum absorbance at 512 nm, and fluorescein has a maximum absorbance at 498 nm, all of which dyes exhibit significant absorbance at 532 nm and, thus, are useful dyes for a YAG laser emitting at 532 nm. Dyes which exhibit significant absorbency at the 355 nm wavelength are carbostyril 124 (maximum absorbence 349 nm) carbostyril 165 (maximum absorbence 360 nm) coumarin 2 (maximum absorbence at 365 nm) and coumarin 120 (maximum absorbency 352 nm) and, thus, are useful for incorporation into epoxy based resins to be ablated by YAG lasers that emit at 355 nm wave length. Coumarin 4 (maximum absorbency 322 nm) is useful for lasers emitting at 308 nm and p-terphenyl (maximum absorbency 276 nm) is useful for lasers emitting at 266 nm.

One or more of the energy absorbing dyes described above are added to the epoxy based resin, preferably at about 0.01 to about 1.0 part by weight per 100 parts by weight of the epoxy resin. A single dye can be utilized, or multiple dyes can be used to increase the ablatability to lasers emitting at different wavelengths.

The material may also be photoimageable by photolithographic techniques, in which case a photoinitiator, preferably triarylsulfonium hexafluroantimonate, is included in the composition. Other useful photoinitiators include diphenyl iodonium salts and their derivatives. A particular advantage to Rhodamine B and Ethyl Violet is that when they are used with compositions that contain photoinitiators, such as triarylsulfonium hexafluroantimonate, they do not interfere with the photochemical and curing reactions.

Alternatively, thermally labile cationic photoinitiators that initiate polymerization of the epoxy functionality by exposure to light or by exposure to temperatures above about 125° C., such as alkoxy substituted aryl onium salts of the type disclosed in U.S. Pat. No. 4,882,221 and 5,079,778, can be utilized. On the other hand, the addition of anthrone or other curing agents will allow epoxy formulations to be thermally stable up to about 150° C., above which temperature it will polymerize. Other curing agents can be chosen to cure the film as low as 80° C. The epoxy based composition with the dye or dyes added thereto is especially adapted for use as a dielectric material to coat onto a substrate to form a circuitized I/C chip carrier or circuit board with micro vias formed therein. The material can be applied as a solution and then dried, as disclosed in U.S. Pat. No. 5,026,626, and 5,330,402, or it can be formed into a dry film and applied to the substrate by laminating techniques as disclosed in U.S. patent application Ser. No. 09/212,204. Also, a solventless film can be formed and applied to a substrate, such as a copper foil, and cured.

There are several techniques for applying and further processing dielectric film on substrates. One technique for applying film is to first apply the film to a substrate in either dry film form or coated film form and cured. Vias are then laser ablated, following which copper is plated onto the surface and into the vias and then patterned. In another technique, after the dielectric film has been applied or laminated, a copper foil is laminated onto the surface of the dielectric film and the film cured before the vias are formed. Vias are then laser ablated through both the copper foil and the dielectric film, after which the vias are plated with copper and the copper foil is patterned. Alternatively, the copper can be etched at the locations where the vias are to be formed, and then the vias laser ablated. In yet another technique, the dielectric film can be either laminated to a copper foil, or coated onto a copper foil. The dielectric film, with the copper foil backing is then laminated to the substrate, cured, and processed as in the previous example. In any event, the laser ablation technique lends itself to forming circuitized substrates.

Solvent Containing Dielectric Film

One especially useful epoxy based polymeric dielectric has solids which are preferably comprised of from about 10% to 80%, preferably from 20% to 40%, more preferably about 30%, of phenoxy polyol resin which is the condensation product of epichlorohydrin and bisphenol A, having a molecular weight of from about 40,000 to 130,000, preferably about 60,000 to 90,000, more preferably greater than 60,000; from about 0% to 80%, preferably from about 25% to 30%, most preferably about 25%, of an epoxidized multifunctional bisphenol A formaldehyde novalac resin having a. molecular weight of from about 4,000 to 10,000, preferably about 5,000 to 7,000; from 0% to 90%, preferably from about 35% to 50%, more preferably 40% to 45%, most preferably about 45%, of a diglycidyl ether of bisphenol A, preferably brominated, having a molecular weight of from about 600 to 2,500, preferably about 1,000 to 1,700. A dye or dyes that absorb energy significantly at the emitting wavelength for the laser ablation for one or more lasers is added to the epoxy base, preferably at from about 0.01 to about 1.0 part by weight per 100 parts by weight of the resin component. If the composition is to be photoimageable, a photo initiator is present at from about 0.1 to about 15 parts, preferably about 5 parts by weight, of the total resin weight. Preferably, the photoinitiator is a cationic photoinitiator having sulfur moiety such as a complex triarylsulfonium hexafluoroantimonate salt. A suitable complex triarysulfonium hexafluoroantimonate salt cationic photoinitiator formerly available as UVE 1014 from General Electric Company, is now available as UVI 6974 from Union Carbide Company. The solvent component of the dielectric film preferably is comprised of propylene glycol monomethyl ether acetate, and 0% to less than about 10% propylene carbonate and 0% to less than about 50% of methyl ethyl ketone. The propylene carbonate is preferably the conveyor for the preferred photoinitiator if a photoinitiator is to be incorporated in the composition.

Preferably, the phenoxy polyol resin has an epoxide value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000 and a glass transition temperature of from about 80 to about 150, more preferably from about 90 to about 110, most preferably about 98° C.

Preferably, the multifunctional epoxy bisphenol A formaldehyde novalac resin has an epoxide value of from about 1 to about 10, more preferably from about 3 to about 6, most preferably about 4.7 equivalents per kilogram, a weight per epoxide of from about 180 to about 300, more preferably from about 190 to about 230, most preferably about 215 and a melting point of from about 60° C. to about 150° C., more preferably from about 70° C. to about about 90° C., most preferably about 82° C.

Preferably, the diglycidyl ether of the bisphenol A has an epoxide value of from about 0.1 to about 5, more preferably from about 1 to about 3, most preferably about 1.5 equivalents per kilogram, a weight per epoxide of from about 200 to about 1,000, more preferably from abut 500 to about 750, most preferably about 675 and a melting point of from about 70 to about 150, more preferably from about 80 to about 110, most preferably about 97° C.

A suitable phenoxy polyol resin is available under the trade name "PKHC", formerly available from Union Carbide Corporation, and now from Phenoxy Resin Associates. A suitable octafunctional bisphenol A, formerly available under the trade name "Epirez SU-8" from High Tek Polymers, is now available as "Epon SU8" from Shell Chemical Company. A suitable tetrabromobisphenol A, formerly available under the trade name "Epirez 5183" from High Tek Polymers, is now available as "Epon 1183" from Shell Chemical Company.

If a photoinitiator is not used so that there is not the photoimaging characteristic of the film, thermal curing agents, such as dicyanodiamide (DICY) or bisphenol or substituted bisphenols, can be added. Catalytic agents, such as 2-methylimidazol or 2-ethyl, 4-methylimidizol, can also be incorporated into the composition.

The solids of the photoimageable dielectric film optionally comprise a particulate rheology modifier, preferably a thixotropic particulate rheology modifier. Preferably, the particulate rheology modifier has an average particle size of from about 0.001 to about 10 microns, more preferably from about 0.01 to about 5 microns. Examples of particulate rheology modifiers are barium sulfate, talc, aluminum oxide, antimony oxide, kaolin, finely divided silicon dioxide which may be colloidal or rendered hydrophobic, micronised talcum, micronised mica, kaolin, aluminum oxide, aluminum hydroxide, calcium silicate, aluminum silicate, magnesium carbonate, calcium carbonate, zirconium silicate, porcelain powder, glass powder, antimony trioxide, titanium dioxide, barium titanate and barium sulfate or mixtures thereof Preferably, the particulate rheology modifier is silica; a suitable silica is available under the trade name Aerosil A380 silica from Degussa. Where the particulate rheology modifier is a thixotropic particulate rheology modifier, it is preferred that no more than 30% be used.

Optionally, a surfactant, such as for example a nonionic surfactant, is employed. Preferably, the surfactant is a fluorinated polyether; a suitable surfactant is available under the trade name FC-430 from 3M Company In other embodiments, solventless epoxy systems are used. A preferred solventless system is disclosed in commonly assigned U.S. patent application Ser. No. 09/212,204, filed 12/15/98, which is incorporated herein by reference. Again, a photoinitiator may be used if photoimaging is required, but can be omitted if photoimaging is not required.

The Solventless Dielectric Film

The solventless dielectric film is a high resolution dielectric material. Preferably, the dielectric constant of the dielectric film is less than about 5, more preferably less than about 4. The dielectric film is thermally stable up to about 340° C. The dielectric film preferably is comprised of about 95% or more solids. The epoxy resin system comprises from about 10% to 80% of phenoxy polyol resin which is the condensation product of epichlorohydrin and bisphenol A, having a molecular weight of from about 40,000 to about 130,000; from about 0% to about 80% of an epoxidized multifunctional bisphenol A formaldehyde novolac resin, having a molecular weight of from about 4,000 to about 10,000; from 10% to 50% of a diglycidyl ether of bisphenol A, having a molecular weight of from about 600 to 2,500; from about 10% to about 35% liquid epoxy resin, having a molecular weight of from about 200 to about 600, preferably from about 250 to about 450. The "liquid epoxy resins" are liquid at 20° C. Preferably, the liquid epoxy resins are selected from the group consisting of a cycloaliphatic epoxy resin, a bisphenol A epoxy resin, and mixtures thereof In one embodiment of the solventless film, the solids comprise an epoxy resin system which is preferably comprised of from about 10% to about 80%, preferably from 10% to about 40%, more preferably from about 15% to about 30% of the phenoxy polyol resin, which is the condensation product of epichlorohydrin and bisphenol A, having a molecular weight of from about 40,000 to about 130,000, preferably about 60,000 to about 90,000, more preferably greater than 60,000; from 0% to about 80%, more preferably from about 12% to about 30%, most preferably from about 15% to about 20%, of an epoxidized multifunctional bisphenol A formaldehyde novolac resin, having a molecular weight of from about 4,000 to about 10,000, preferably about 5,000 to about 7,000; from about 10% to about 50%, preferably from about 25% to about 40%, more preferably about 27% to about 35% of a diglycidyl ether of bisphenol A, having a molecular weight of from about 600 to about 2,500, preferably about 1,000 to about 1,700; from about 10% to about 35%, preferably from about 13% to about 32%, more preferably from about 20% to about 30%, liquid epoxy resin. If the film is to be photoimageable, from about 0.1 to about 15 parts, preferably about 5 parts by weight to 100 parts by weight of the total resin weight, of a cationic photoinitiator is added. The solids optionally comprise a particulate rheology modifier from 0 to about 30%, preferably from 0.25% to about 30%, preferably from about 0.3% to about 5%, most preferably from about 0.5% to about 4%.

In another embodiment of the solventless film, the solids comprise an epoxy resin system which is preferably comprised of from about 5% to about 80%, preferably from 10% to about 40%, more preferably from about 15% to about 30% of the phenoxy polyol resin, 0% of the epoxidized multifunctional bisphenol A formaldehyde novolac resin, from about 20% to about 80%, preferably from about 30% to about 70%, more preferably about 40% to about 60% of the diglycidyl ether of bisphenol A; from about 10% to about 35%, preferably from about 13% to about 32%, more preferably about 20% to about 30%, liquid epoxy resin. If the film is to be photoimageable from about 0.1 to about 15 parts, preferably about 5 parts by weight, of the total resin weight, a cationic photoinitiator is added. The solids optionally comprise a particulate rheology modifier from 0% to about 30%, preferably from 0.25% to about 30%, preferably from about 0.3% to about 5%, most preferably from about 0.5% to about 4%.

The diglycidyl ether of bisphenol A is preferably halogenated, more preferably bromonated. The solvent component left over after processing of the photoimageable dielectric film preferably is comprised of propylene glycol monomethyl ether acetate, 0% to less than about 10% of the solvent, propylene carbonate, 0% to less than about 50% methyl ethyl ketone. The propylene carbonate is preferably the carrier for the preferred photoinitiator.

Preferably, the phenoxy polyol resin has an epoxy value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000 and a glass transition temperature of from about 80° to about 150° more preferably from about 90° to about 110°, most preferably about 98° C.

Preferably, the multifunctional epoxy bisphenol A formaldehyde novolac resin has an epoxy value of from about 1 to about 10, more preferably from about 3 to about 6, most preferably about 4.7 equivalents per kilogram, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the bisphenol A has an epoxy value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70° C. to about 150° C., more preferably from about 80° C. to about 110° C., most preferably about 97° C.

The liquid epoxy resin has a weight average molecular weight of from about 200 to about 500, preferably from about 250 to about 450. Preferably, the liquid epoxy resin is either a bisphenol A epoxy resin or cycloaliphatic epoxy resin. The bisphenol A epoxy resin is a reaction product of bisphenol A and epichlorohydrin, and has an epoxy value of from about 10 to about 4, more preferably from about 7 to about 5, most preferably about 5.5 equivalents per kilogram, a weight per epoxide of from about 100 to about 250, more preferably from about 150 to about 200, most preferably about 180, a weight average molecular weight of from about 200 to about 500, preferably from about 250 to about 450, more preferably from about 300 to about 400, and a melting point of below about 20° C. A suitable bisphenol A epoxy resin is a difunctional bisphenol A epoxy resin available under the tradename Epon 826. The Epon 826 resin from Shell Oil Corporation has an epoxide equivalent weight of from about 178 to about 186 and a density of 1.6 grams/cm$^2$ Preferably, the cycloaliphatic epoxy resin has an epoxy value of from about 10 to about 5, more preferably from about 8 to about 6, most preferably about 7.3 equivalents per kilogram, a weight per epoxide of from about 100 to about 200, more preferably from about 120 to about 150, most preferably about 137, a weight average molecular weight of from about 200 to about 500, preferably from about 250 to about 450, and preferably a melting point of below about 20° C. Preferably, the cycloaliphatic epoxy resin is a cycloaliphatic difunctional epoxy resin, more preferably cycloaliphatic epoxy resin is 3, 4-epoxycyclohexylmethyl 3, 4-epoxycyclohexane-carboxylate. A suitable 3, 4-epoxycyclohexylmethyl 3, 4-epoxy-cyclohexane-carboxylate resin is sold by Union Carbide under the trademark "ERL-4221." This resin has an epoxy equivalent weight of from 131 to about 143, a freezing point of less than −20° C., a specific gravity of 1.18, and an approximate average molecular weight of from about 262 to about 286.

Other suitable liquid epoxy resins are vinyl cyclohexene dioxide, available under the. trade name "ERL-4206" from Union Carbide, 2-(3, 4-epoxycyclohexyl-5, 5-spiro-3, 4-epoxy) cyclohexane-meta-dioxane, available under the trade name "ERL-4234" from Union Carbide, Bis (3, 4-epoxy cyclohexyl) adipate, available under the trade name "ERL 4299". ERL-4299 has a freezing point of approximately 9° C., a specific gravity of 1.15 and an epoxy equivalent weight of from about 190 to about 210 and an average approximate molecular weight of from about 380 to 420; ERL-4206 has a freezing point of -55° C., a specific gravity of 1.09, an epoxy equivalent weight of from about 70 to about 74 and an average approximate molecular weight of from about 140 to 148; ERL4234 has a melting point of approximately 0° C., a specific gravity of 1.18, an epoxy equivalent weight of from about 133 to about 154 and an average approximate molecular weight of from about 266 to 318.

A suitable phenoxy polyol resin is available under the trade name "PKHC", or "PKHJ", formerly from Union Carbide Corporation, now from Phenoxy Resin Associates. A suitable octafunctional bisphenol A, formerly available under the trade name "Epirez SU8" from High Tek Polymers, is now available as "Epon SU8" from Shell Chemical Company. A suitable tetrabromobisphenol A formerly available under the trade name "Epirez 5183" from High Tek Polymers, is now available as "Epon 1183" from Shell Chemical Company. A suitable complex triarylsulfonium hexafluoroantimonate salt photoinitiator, formerly available under the trade name UVE 1014 from General Electric Company, is now available as UVI 6974 from Union Carbide Company. The UVI 6974 is a 50% solution of triarylsulfonium hexafluoroantimonate salt in propylene carbonate.

The solids of the photoimageable dielectric film optionally comprise a particulate rheology modifier, preferably a thixotropic particulate rheology modifier. Preferably, the particulate rheology modifier has an average particle size of from about 0.001 to about 10 microns, more preferably from about 0.01 to about 5 microns. Examples of particulate rheology modifiers are barium sulfate, talc, aluminum oxide, antimony oxide, kaolin, finely divided silicon dioxide which may be colloidal or rendered hydrophobic, micronised talcum, micronised mica, kaolin, aluminum oxide, aluminum hydroxide, calcium silicate, aluminum silicate, magnesium carbonate, calcium carbonate, zirconium silicate, porcelain powder, glass powder, antimony trioxide, titanium dioxide, barium titanate and barium sulfate or mixtures thereof Preferably, the particulate rheology modifier is silica; a suitable silica is available under the trade name Aerosil A380 silica from Degussa. Where the particulate rheology modifier is a thixotropic particulate rheology modifier, it is preferred that no more than 30% be used.

Optionally, a surfactant, such as for example a nonionic surfactant, is employed. Preferably the surfactant is a fluoronated polyether; a suitable surfactant is available under the trade name FC-430, from 3M Company.

Any residual solvent content left over from the manufacturing process in the uncured photoimageable dielectric film preferably ranges from about 0 to 5%, more preferably from about 0 to 3%, most preferably from about 0 to less than about 2%, by weight of the film.

While the invention had been described with a certain degree of particularity, various adaptations and modifications can be made without departing from the scope of the invention as defined in the appended claims.

What is claimed is:

1. A process for manufacturing an interconnect structure containing a build-up dielectric layer containing at least one opening comprising the steps of:
    a) providing a substrate,
    b) coating the substrate with a dielectric composition for making interconnect films, said composition comprising:
        1) an epoxy base resin consists essentially of:
            (i) between about 10% and about 80% by weight of a polyol resin which is a condensation product of epichlorohydrin and bisphenol A;
            (ii) about 0% to about 80% by weight of a multifunctional bisphenol A formaldehyde novalak resin;
            (iii) about 10% to about 50% by weight of a glycidyl ether of bisphenol A; and
            (iiii) about 10% to about 35% of a liquid epoxy resin
        2) from about 0.1 to about 15 parts by weight per 100 parts of a curing agent capable of initiating polymerization of said epoxy base resin;
        3) from about 0.01 to about 1 parts by weight of a dye having a substantial absorbtivity at the wavelength of emission of the light of a laser beam;
    c) curing the film; and
    d) forming at least one opening in the dielectric composition by laser ablation.

2. The invention of claim 1 wherein the curing agent is a thermally activated compound which can initiate polymerization of the epoxy functionality by exposure to temperatures above about 125° C.

3. The invention of claim 1 wherein the curing agent is a thermally labile cationic photoinitiator which can initiate polymerization of the epoxy functionality by exposure to light or by exposure to temperatures above about 125° C. in the absence of light.

4. The invention of claim 1 wherein the dye is selected from the group consisting of rhodamine B, ethyl violet, 2', 7'-dichlorofluorescein, carbostyril 124, carbostyril 165, coumarin 2, coumarin 120, coumarin 4, p-terphenyl, and fluorescein.

* * * * *

UNITED STATES PATENT AND TRADEMARK OFFICE
CERTIFICATE OF CORRECTION

PATENT NO. : 6,689,543 B2
DATED : March 26, 2002
INVENTOR(S) : John S. Kresge et al.

It is certified that error appears in the above-identified patent and that said Letters Patent is hereby corrected as shown below:

<u>Title page,</u>
Item [*] Notice, change "0 days" to read as -- 29 days --.

Signed and Sealed this

Thirteenth Day of July, 2004

JON W. DUDAS
*Acting Director of the United States Patent and Trademark Office*